United States Patent [19]
Kashiwagi

[11] Patent Number: 5,649,836
[45] Date of Patent: Jul. 22, 1997

[54] ELECTRICAL CONNECTOR HAVING A MENBER PRELOADING A CONTACT TO REDUCE AN INSERTION FORCE

[75] Inventor: Shigeru Kashiwagi, Tokyo, Japan

[73] Assignee: Japan Aviation Electronics Industry, Limited, Japan

[21] Appl. No.: 543,339

[22] Filed: Oct. 16, 1995

[30]    Foreign Application Priority Data

Oct. 18, 1994   [JP]   Japan ..................... 6-251734

[51] Int. Cl.$^6$ .................................................. H01R 4/50
[52] U.S. Cl. ............................................ 439/342; 439/259
[58] Field of Search .......................... 439/342, 259–270, 439/347, 79

[56]         References Cited

U.S. PATENT DOCUMENTS

| | | | |
|---|---|---|---|
| 4,618,199 | 10/1986 | Pfaff | 439/264 |
| 5,044,973 | 9/1991 | Noda et al. | 439/296 |
| 5,454,787 | 10/1995 | Hsu | 439/342 |

FOREIGN PATENT DOCUMENTS

| | | |
|---|---|---|
| 60-162391 | 10/1985 | Japan . |
| 2-16542 | 5/1990 | Japan . |
| 0216542 | 5/1990 | Japan . |
| 2-192679 | 7/1990 | Japan . |

*Primary Examiner*—Hein Vu
*Attorney, Agent, or Firm*—Laff, Whitesel, Conte & Saret, Ltd.

[57]           ABSTRACT

An electrical connector comprises a cover insulator and a base insulator relatively movable with respect to each other in a first direction. The base insulator has a plurality of conductive contacts assembled to extend in a second direction perpendicular to the first direction. The cover insulator has a plurality of pin insertion holes in one-to-one correspondence to the contacts. A board has a plurality of conductive terminal pins to be inserted in the second direction into the pin insertion holes in one-to-one correspondence. Each contact has a pair of resilient contact pieces biased in a third direction perpendicular to the first and the second directions when the cover insulator is moved in the first direction. Each of the resilient contact pieces has a contacting portion to be contacted to or released from each of the terminal pins. The cover insulator is provided with a plurality of preload projections protruding from one surface thereof to preliminarily bias the resilient contact pieces until the terminal pins are moved to be received between the contacting portions. The terminal pin and the preload projection are in a positional relationship such that either one is located at a position corresponding to the contact and can be moved to another position where it is separated from the contact.

9 Claims, 6 Drawing Sheets

ELECTRICAL CONNECTOR HAVING A MENBER PRELOADING A CONTACT TO REDUCE AN INSERTION FORCE

BACKGROUND OF THE INVENTION

The present invention relates to an electrical connector for connecting or disconnecting a conductive pin to or from a contact by moving a connector part together with the conductive pin in a direction perpendicular to an axis of the contact and, in particular, to such an electrical connector having a preload member for preloading or biasing the contact prior to connection between the conductive pin and the contact so as to achieve a so-called zero-insertion force.

In a known electrical connector for electrically connecting or disconnecting a number of terminal pins of an LSI (large scale integrated) circuit to or from a circuit board, a base insulator having a plurality of contacts are mounted onto the circuit board. A cover insulator is assembled onto the base insulator to be relatively movable in a moving direction normal to the axis of each contact. The cover insulator has a plurality of holes for passing the terminal pins of the LSI circuit therethrough and also has a plurality of preload pins each of which is disposed adjacent to each of the holes in the moving direction. The preload pins are similar in dimension to the terminal pins. When the cover insulator is located at a first position, the preload pins are in contact with the contacts to preload or bias the contacts, respectively, in a biasing direction normal to the moving direction. When the cover insulator is moved in the moving direction together with the LSI circuit with the terminal pins inserted in the holes in the cover insulator, the terminal pins are brought into contact with the contacts of the connector in place of the preload pins. That is, since the contacts are preloaded or biased in the biasing direction before the terminal pins come into contact with the contacts so as to readily accept the terminal pins, a reduced force is only required for moving the cover insulator in the moving direction to bring the terminal pins into contact with the contacts.

The connector of this type will herein be referred to as a preload-type connector.

The preload-type connector described above is disclosed in JPY 2-16542 (Jikkohei 2-16542) and JPU 60-162391 (Jikkaisho 60-162391).

U.S. Pat. No. 5,044,973 corresponding to JPA 2-192679 (Tokkaihei 2-192679) discloses another preload-type connector which is improved in that the preload pins are fixed to a slider insulator which is movable in the moving direction but independently from the cover insulator. The slider insulator has a plurality of elongated holes for passing the terminal pins therethrough. The elongated holes are greater than the holes of the cover insulator in the moving direction. The slider insulator is moved beforehand to preload the contacts by the preload pins. Then, the cover insulator is moved together with the LSI circuit to bring the terminal pins to positions of the contacts. Thereafter, the slider insulator is further moved to free the contacts from the preloaded condition. Thus, the contacts come into contact with the terminal pins.

In the known preload-type connectors, the preload pins are attached or fixed to the cover insulator or the slider insulator. The fixing process is very complicated because it is difficult to fix the preload pins to the insulator at desired positions with a high accuracy and a precise orientation. Furthermore, the preload pins may be deformed during the fixing process.

On the other hand, contacting portions of the contacts engage or come into contact not only with the terminal pins but also with the preload pins. Therefore, the contacting portions are readily worn and contaminated so that the reliability of the contacts is lowered and the lifetime of the contacts becomes short.

SUMMARY OF THE INVENTION

Accordingly, it is an object of the present invention to provide an electrical connector of a preload type which is easy in production and use, low in cost, high in reliability, and long in lifetime.

According to the present invention, an electrical connector of a preload type for electrically connecting or disconnecting a conductive pin is obtained which comprises a base insulator, a cover insulator assembled onto the base insulator and relatively movable in a first direction, the cover insulator having a hole extending in the second direction for passing the conductive pin therethrough, a contact fixed to the base insulator and extending in a second direction normal to the first direction, and a preload member disposed at a position adjacent the hole in the first direction to extend from the cover insulator, the preload member being in contact with the contact to bias the contact in a third direction perpendicular to the first and the second directions when the cover insulator is at a first position, the conductive pin being brought into contact with the contact in place of the preload member released from the contact when the cover insulator is moved from the first position to a second position in the first direction together with the conductive pin inserted in the hole, wherein the preload member is a preload projection formed integral with the cover insulator to form a single body and having a projected end.

DESCRIPTION OF THE PREFERRED EMBODIMENT

Figure 1:
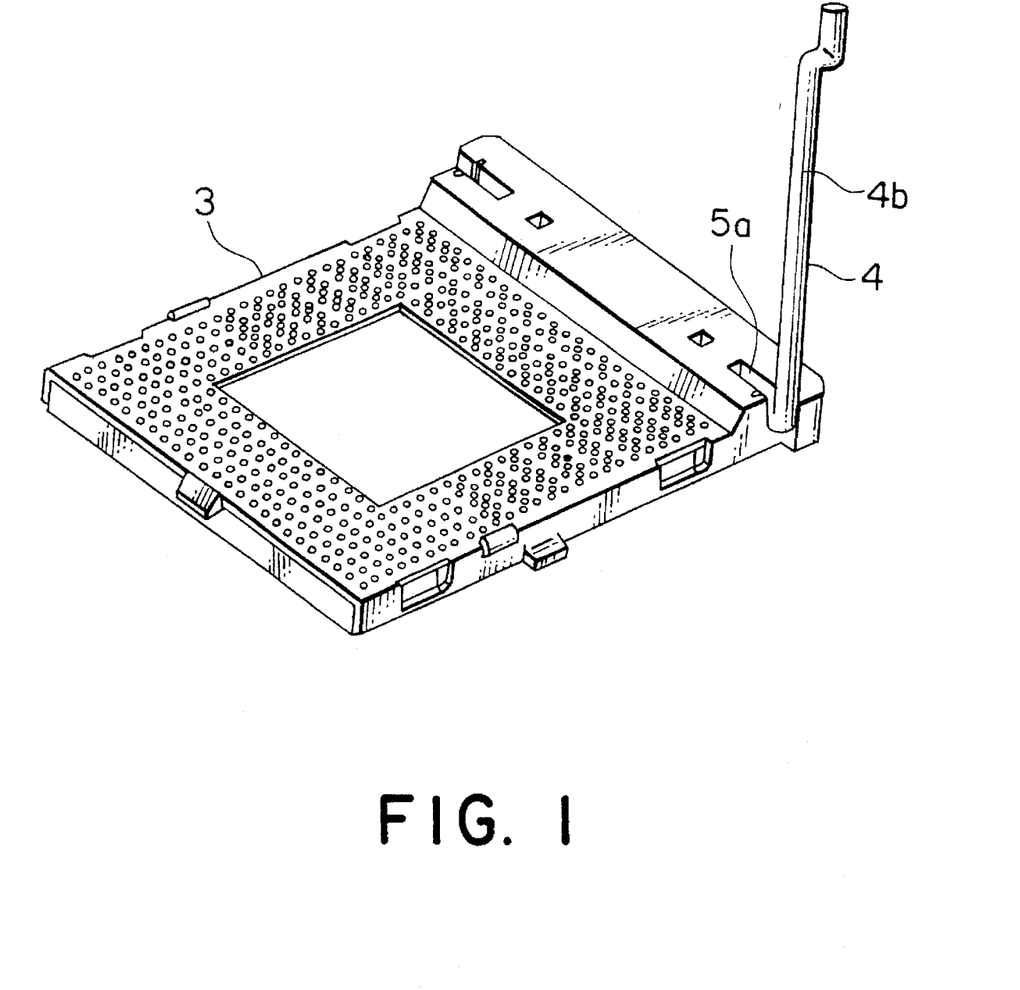
FIG. 1 is a perspective view of an electrical connector according to one embodiment of this invention.
Figure 2:
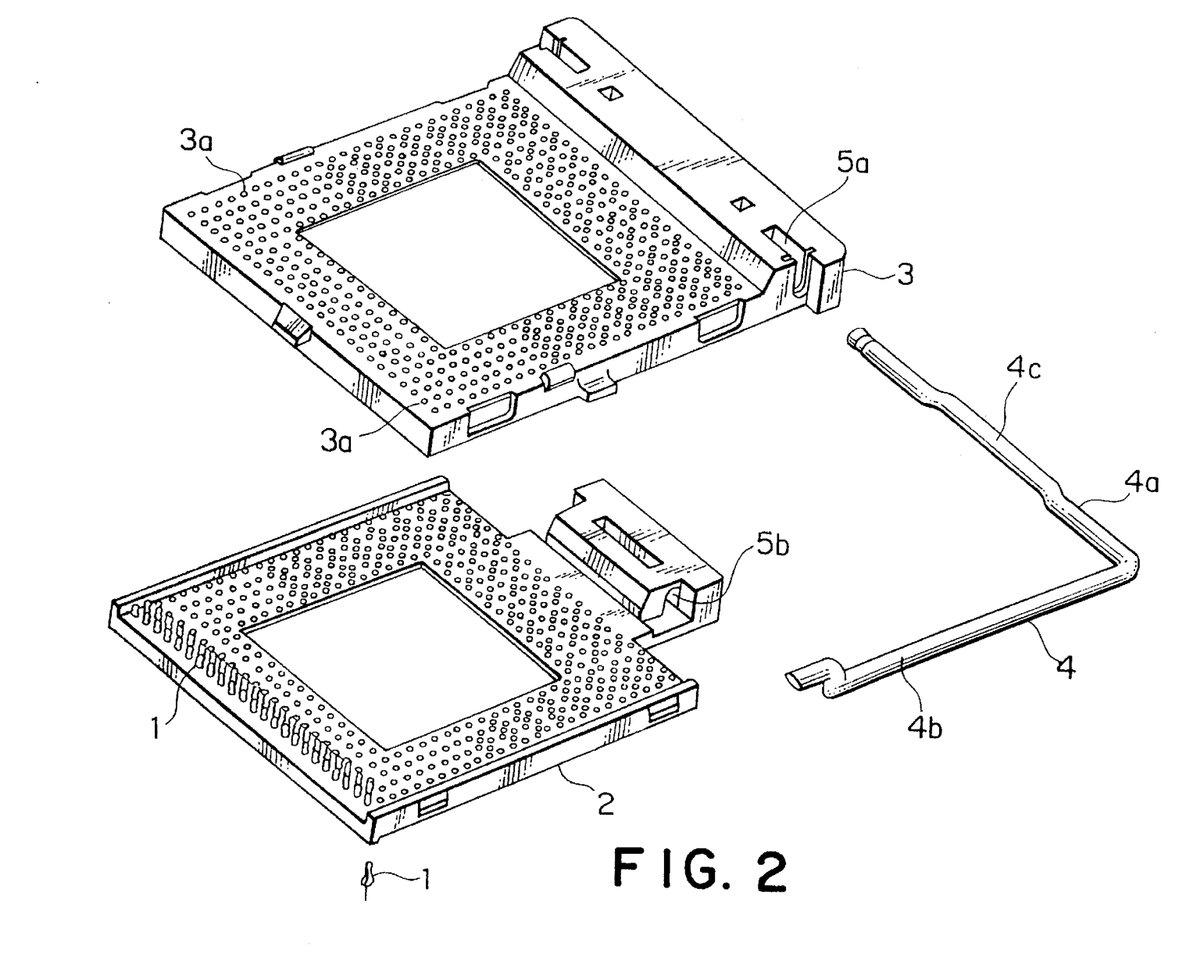
FIG. 2 is an exploded perspective view of the electrical connector illustrated in FIG. 1.

FIG. 1 shows an external appearance of an electrical connector according to one embodiment of this invention. FIG. 2 shows the electrical connector illustrated in FIG. 1 in a disassembled state.

Referring to FIGS. 1 and 2, the electrical connector comprises a plurality of conductive contacts (FIG. 2) such as socket contacts, a base insulator 2 to which the contacts 1 are fixed in a matrix fashion, and a cover insulator 3 coupled onto the base insulator 2.

An operation lever 4 is attached to the base insulator 2 and the cover insulator 3 and serves to move the cover insulator 3 in a predetermined direction or a first direction X with respect to the base insulator 2. The operation lever 4 has a substantially L shape.

Figure 3:
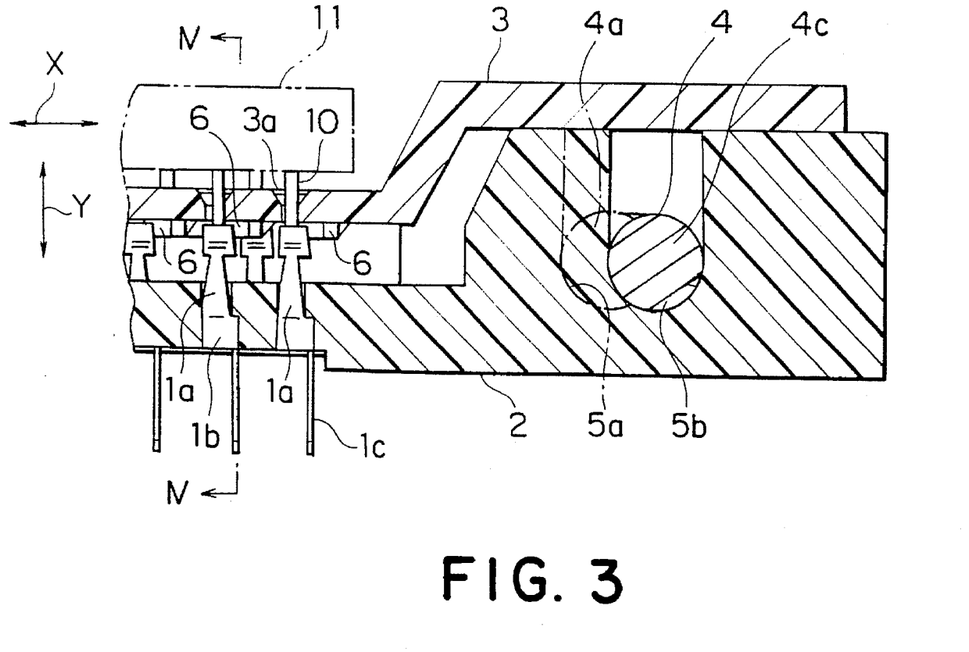
FIG. 3 is a sectional view of a main portion of the electrical connector illustrated in FIG. 1 when terminal pins of the electrical connector are in contact with contacts.
Figure 4:
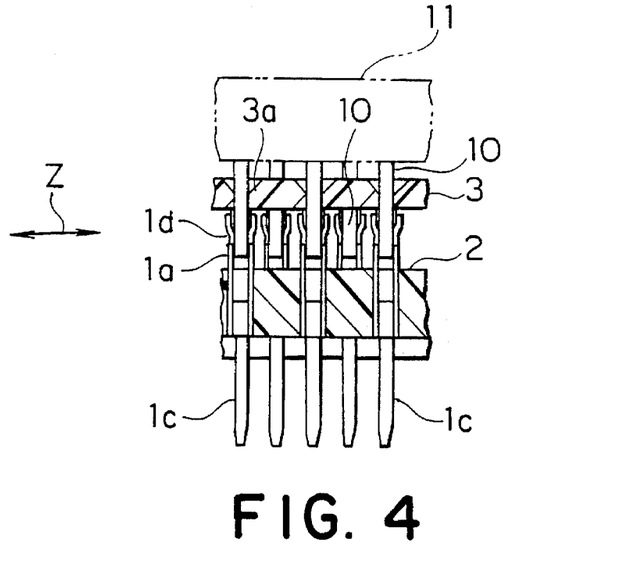
FIG. 4 is a sectional view taken along line IV—IV in FIG. 3.

Referring to FIGS. 3 and 4, a board 11 such as a printed circuit board containing an IC, an LSI, and the like is mounted on the upper surface of the cover insulator 3. On the board 11, a plurality of conductive terminal pins 10 connected to a printed circuit are arranged in a matrix fashion. The terminal pins 10 extend from one board surface confronting the upper surface of the cover insulator 3 through the pin insertion holes 3a which will later be described to the lower surface of the cover insulator 3.

As illustrated in FIG. 3, the cover insulator 3 is coupled to the base insulator 2 to be faced to the base insulator 2 and to be slidable in the first direction X normal to the axis of the terminal pins 10. The direction of the axis of the terminal pins 10 will hereinafter be referred to as a second direction Y. When the operation lever 4 is rotated, the cover insulator 3 is moved in the first direction X with respect to the base insulator 2 to thereby contact or release the terminal pins 10 to or from the contacts 1, as will later be described in detail.

The cover insulator 3 and the base insulator 2 are provided with lever insertion holes 5a and 5b formed at one sides thereof, respectively. When the cover insulator 3 and the base insulator 2 are coupled to each other, the lever insertion holes 5a and 5b communicate with each other to allow the operation lever 4 to pass therethrough.

The operation lever 4 has a pressing portion 4a inserted into the lever insertion holes 5a and 5b, and an operating portion 4b extending from one end of the pressing portion 4a to be perpendicular to the pressing portion 4a. An intermediate part of the pressing portion 4a is parallel-shifted in an axial direction with respect to a remaining part to form a shaft portion 4c. When the operating portion 4b of the operation lever 4 is rotated around the shaft portion 4c, the cover insulator 3 is pressed by the pressing portion 4a to be moved in the first direction X together with the terminal pins 10. In FIG. 3, movement of the pressing portion 4a and the lever insertion holes 5a and 5b is indicated by a solid line and a dash-and-dot line.

The cover insulator 3 is provided with a plurality of the pin insertion holes 3a arranged in a matrix fashion to insert the terminal pins 10 therethrough in one-to-one correspondence. As illustrated in FIG. 3, the cover insulator 3 is coupled to the base insulator 2 so as to be slidable in the first direction X perpendicular to the second direction Y along the axis of the terminal pins 10.

Figure 5:
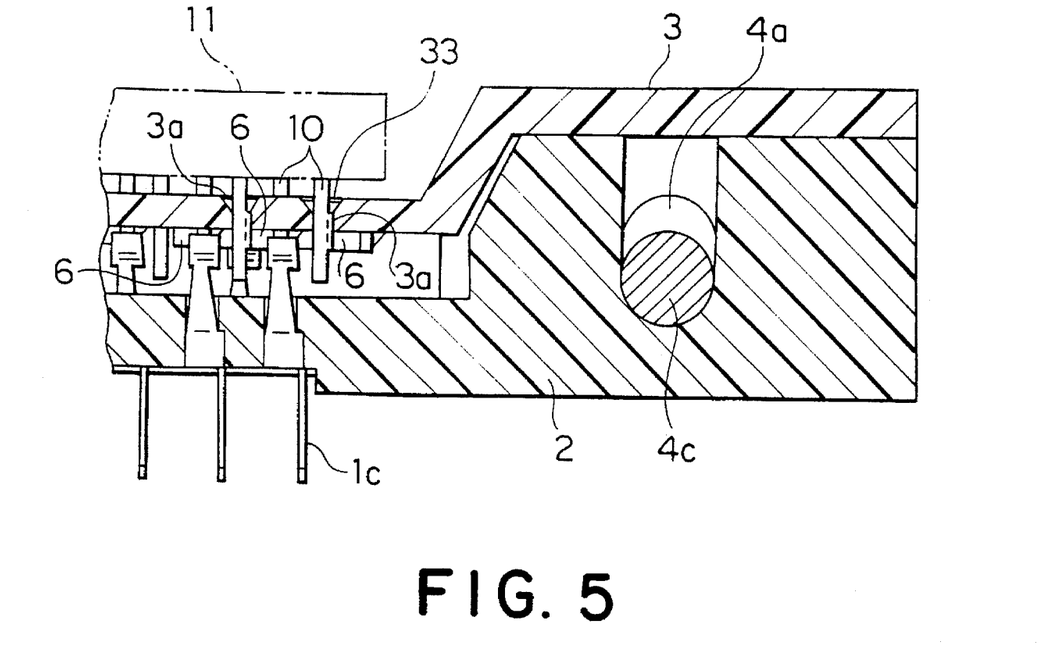
FIG. 5 is a sectional view similar to FIG. 3 when the terminal pins of the electrical connector are out of contact with the contacts.
Figure 6:
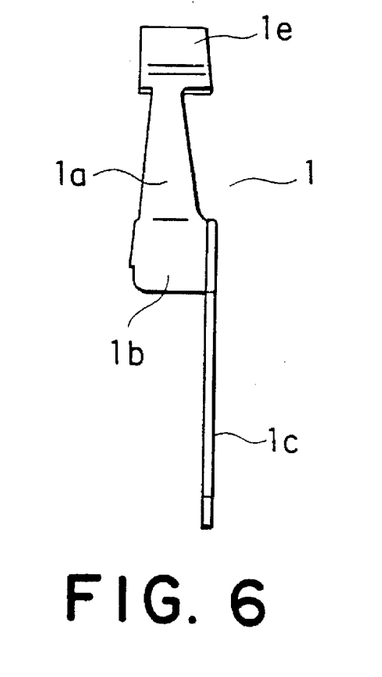
FIG. 6 is a side view of the contact used in the electrical connector according to this invention.
Figure 7:
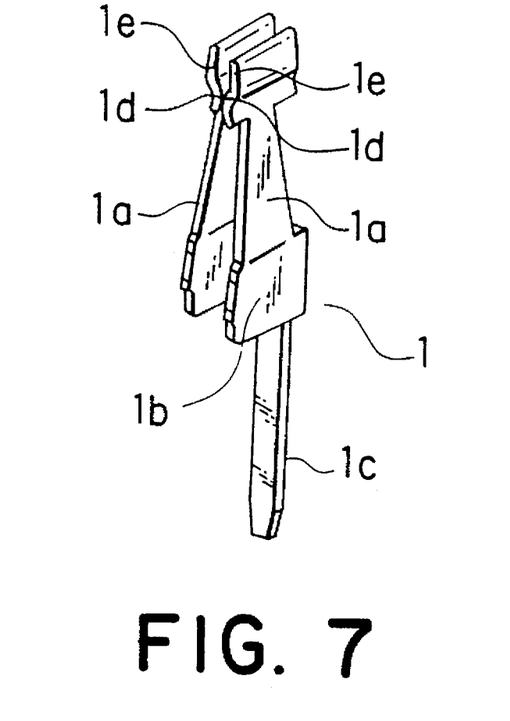
FIG. 7 is a perspective view of the contact illustrated in FIG. 6.
Figure 8:
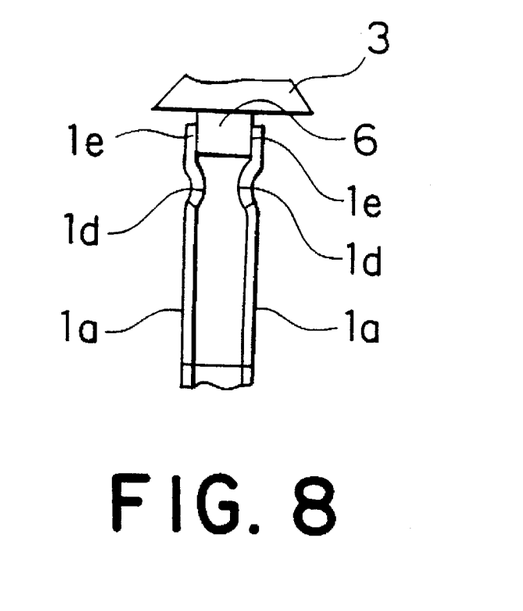
FIG. 8 is a front view of the contact illustrated in FIG. 6 with a preload projection inserted.

Each of the contacts 1 shown in FIGS. 2 through 8 has a pair of resilient contact pieces 1a confronting each other with a space left therebetween, a holding portion 1b connecting and holding one ends of the resilient contact pieces 1a, and a terminal portion 1c extending from the holding portion 1b in a direction opposite to the resilient contact pieces 1a, as best shown in FIGS. 6 and 7. Each of the resilient pieces 1a has a flat leaf-like shape.

Each of the resilient contact pieces 1a has a contacting portion 1d formed at its one end opposite to the other end connected to the holding portion 1b to be contacted with the terminal pin 10, and a free end 1e formed at an endmost position outside the contacting portion 1d. The resilient contact pieces 1a has a curved shape such that the contacting portions 1d approach each other.

As will later be described in detail, each terminal pin 10 inserted into the pin insertion hole 3a of the cover insulator 3 is moved in the first direction X perpendicular to the second direction Y together with the cover insulator 3 to be inserted between the contacting portions 1d of the contact 1. Thus, the contact 1 and the terminal pin 10 are brought into contact with each other.

As shown in FIG. 4, the terminal pin 10 is inserted between the contacting portions 1d to be clamped by resilient force of the contacting portions 1d. Thus, the terminal pin 10 is clamped in a third direction Z perpendicular to a plane defined by the first and the second directions X and Y.

The cover insulator 3 is provided with a plurality of preload projections 6 protruding from the lower surface confronting the free ends 1e of the contacts 1. The preload projections 6 are moved in the first direction X together with the terminal pins 10 and serve to preliminarily bias the resilient contact pieces 1a until the terminal pins 10 are brought into sliding contact with the contacting portions 1d of the contacts 1. The preload projections 6 are made of a material same as the cover insulator 3 and formed integral with the cover insulator 3. The preload projections 6 are arranged so that the pin insertion holes 3a are interposed therebetween in the first direction X. Thus, the preload projections 6 are formed simultaneously when the cover insulator 3 is formed from an insulating resin material.

For convenience of description, consideration will be made as to a single one of the preload projections 6 for a while. Following the sliding movement of the preload projection 6 in the first direction X, the free ends 1e of the resilient contact pieces 1a are brought into contact with the preload projection 6 to expand a space between the contacting portions 1d and are released from the preload projection 6 to narrow the space between the contacting portions 1d. More specifically, the preload projection 6 expands the free ends 1e located above the contacting portions 1d to be contacted with the terminal pin 10 so that the resilient contact pieces 1a are biased in the third direction Z to be opened wide. When the preload projection 6 expands the free ends 1e, the contacting portions 1d are biased together with the resilient contact pieces 1a to expand the space therebetween. The contacting portions 1d are expanded to keep a space equal to an outer diameter of the terminal pin 10.

Figure 9:
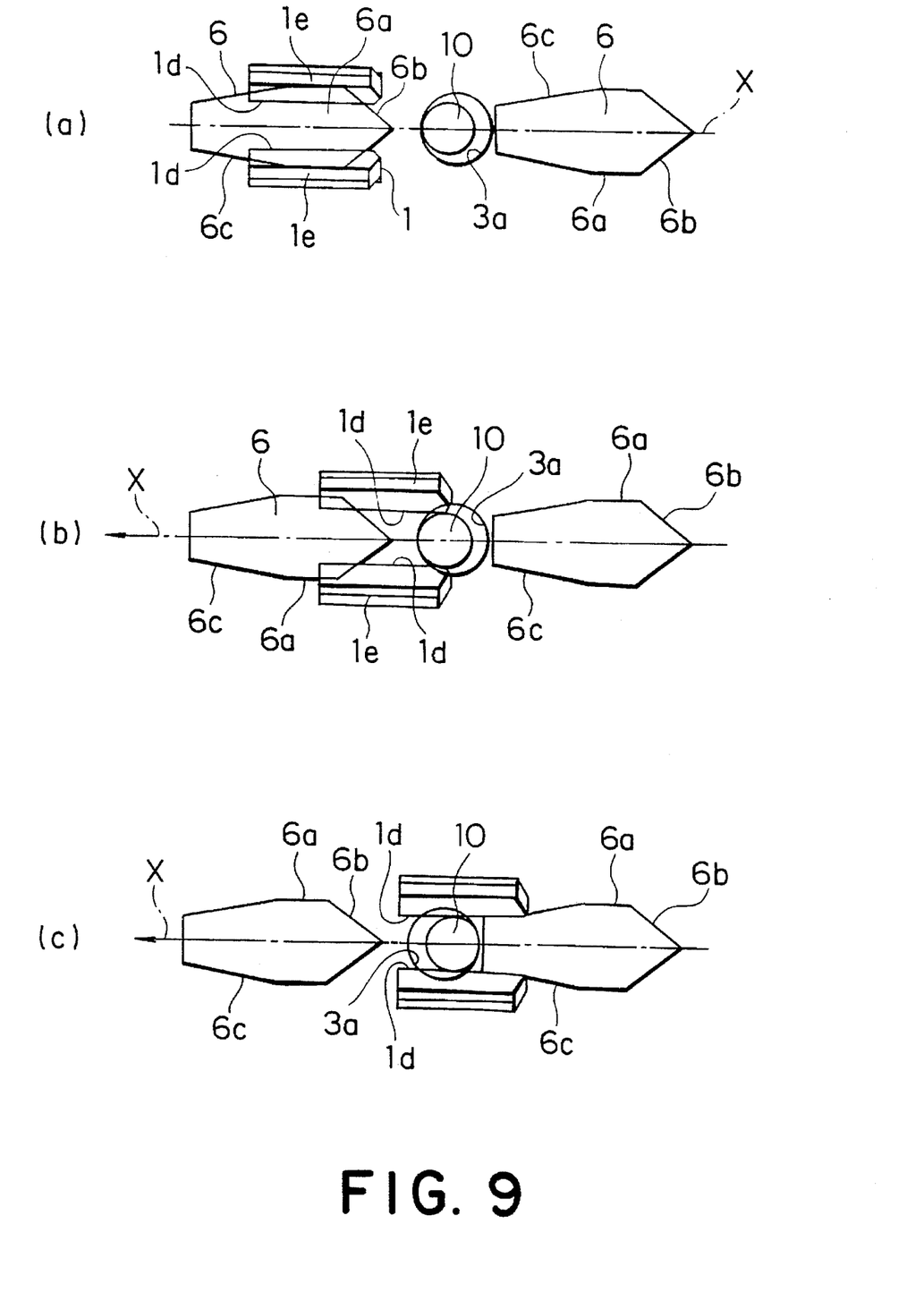
FIGS. 9(a) through 9(c) are plan views for describing an operation of the electrical connector according to this invention, (a) showing a first state in which the terminal pin is disconnected from the contact; (b) showing a second state in which the terminal pin and the contact are at an early stage of connection; (c) showing a third state in which the terminal pin and the contact are connected to each other.

As illustrated in FIGS. 9(a), 9(b), and 9(c), the preload projection 6 has a shape elongated in the first direction X and varied in width in the third direction Z so that the free ends 1e are expanded to keep a space sufficient to insert the terminal pin 10 into the contacting portions 1d with substantially no resistance. Specifically, the preload projection 6 has an intermediate protruding portion 6a having a width greater than the diameter of the terminal pin 10 in the third direction Z, and first and second tapered portions 6b and 6c oppositely extending from the intermediate protruding portion 6a to be tapered in the first direction X.

The terminal pin 10 is movable to a position where it is released from the contacting portions 1d of the contact 1. Likewise, the preload projection 6 is movable to a position where it is released from the free ends 1e of the contact 1. Furthermore, a positional relationship between the terminal pin 10 and the preload projection 6 is determined so that, during the movement, either one of the terminal pin 10 and the preload projection 6 is positioned between the resilient contact pieces 1a of the contact 1. More specifically, the terminal pin 10 is positioned between the contacting portions 1d in one occasion and the preload projection 6 is positioned between the free ends 1e in the other occasion.

Referring to FIGS. 9(a), 9(b), and 9(c) in combination, description will now be made as regards movement of the contact 1, the terminal pin 10, and the preload projection 6 when the contact 1 and the terminal pin 10 are connected to and disconnected from each other.

FIG. 9(a) shows a first state in which the terminal pin and the contact 1 are disconnected from each other. FIG. 9(b) shows a second state in which the terminal pin 10 and the contact 1 are at an early stage of connection. FIG. 9(c) shows a third state in which the terminal pin 10 and the contact 1 are connected to each other.

When the operating portion 4b of the operation lever 4 is rotated to be perpendicular to the upper surface of the cover insulator 3 as illustrated in FIG. 1, the cover insulator 3 is coupled to the base insulator 2 with one sides thereof aligned to each other as illustrated in FIG. 5. In this state, the terminal pin 10 and the contact 1 are separate from each other in the first direction X as illustrated in FIGS. 5 and 9(a). Accordingly, the terminal pin 10 can be inserted into the pin insertion hole 3a without any resistance. The intermediate protruding portion 6a of the preload projection 6 located at the left side in FIG. 9(a) is inserted between the free ends 1e of the resilient contact pieces 1a to outwardly expand the free ends 1e. A space formed between the contacting portions 1d at this time is selected to be substantially equal to the diameter of the terminal pin 10.

Next, let the operating portion 4b of the operation lever 4 be rotated in a direction towards an orientation parallel to the upper surface of the cover insulator 3. In this event, the cover insulator 3 is moved leftward in the figure (leftward in the first direction X) because the pressing portion 4a is pressed against the lever insertion hole 5a of the cover insulator 3. As a consequence, the terminal pin 10 is inserted between the contacting portions 1d. At this time, the intermediate protruding portion 6a of the preload projection 6 is located between the free ends 1e to expand the free ends 1e. Following the expansion of the free ends 1e, the contacting portions 1d are also expanded to provide a space substantially equal to the diameter of the terminal pin 10. Thus, there is no substantial insertion resistance. Once the terminal pin 10 is inserted between the contacting portions 1d, the preload projection 6 is released from engagement with the free ends 1e.

When the operating portion 4b of the operation lever 4 is further rotated to becomes substantially parallel to the cover insulator 3, the cover insulator 3 is further moved leftward in the figure with respect to the resilient contact pieces 1a, as illustrated in FIGS. 3, 4, and 9(c). As a consequence, the terminal pin 10 is moved between the contacting portions 1d in sliding contact therewith to be completely received between the contacting portions 1d. In this state, the terminal pin 10 is contacted with the contacting portions 1d to outwardly expand the contacting portions 1d. Specifically, the terminal pin 10 is contacted with the contacting portions 1d at a center of the contacting portions 1d. At this time, as illustrated in FIG. 9(c), the preload projection 6 at the left side in the figure is completely released from the contact 1. On the other hand, the first tapered portion 6c of another preload projection 6 at the right side in the figure with respect to the pin insertion hole 3a is slightly inserted between the free ends 1e. Since the first tapered portion 6c has a width smaller than the space between the free ends 1e, no influence is given to opening and closing operations of the free ends 1e.

The first tapered portion 6c at one side of the preload projection 6 has a width smaller than that of the intermediate protruding portion 6a so as to be inserted between the free ends 1e with a space.

In FIGS. 9(a), 9(b), and 9(c), the right-hand preload projection 6 serves to perform a similar operation to another contact 1, another pin insertion hole 3a, and another terminal pin 10 adjacent to those illustrated in the figure.

In order to disconnect the terminal pin 10 and the contact 1, the base insulator 3 is reversely moved by the rotation of the operation lever 4 to turn the third state illustrated in FIG. 9(c) into the first state illustrated in FIG. 9(a).

In the electrical connector according to this invention having the above-mentioned structure, the movement of the cover insulator 3 makes the preload projection 6 expand the contacting portions 1d of the contact 1 via the free ends 1e to bring the terminal pin 10 into contact with the contacting portions 1d.

The preload projection 6 widely expand the free ends 1e to expand the contacting portions 1d so that the terminal pin 10 is smoothly brought into sliding contact with the contacting portions 1d. As described above, the preload projection 6 is brought into sliding contact with the free ends 1e and is not brought into sliding contact directly with the contacting portions 1d.

In the electrical connector according to this invention, the preload projection 6 expands the contacting portions 1d via the free ends 1e to make the contacting portions 1d have a width substantially equal to the diameter of the terminal pin 10. Accordingly, substantially no force is required to insert the terminal pin 10 between the contacting portions 1d. This reduces connection force (=releasing force=[contacting force per one contact]×[the number of contacts]×[kinetic frictional coefficient]) required to connect the terminal pin 10 and the contact 1. As a consequence, moving force of the terminal pin 10 is also reduced. It is therefore possible to assemble a large number of the contacts 1. Since the terminal pin 10 and the preload projection 6 are not simultaneously subjected to the contacting force or the releasing force, the force applied to each of the terminal pin 10, the base insulator 2, and the cover insulator 3 is reduced as compared with the prior art. It is therefore possible to avoid deformation or damage of the terminal pin 10. Therefore, the terminal pin 10 of a greater size is no longer required to improve the durability.

It is unnecessary to assemble the preload pins as separate parts as disclosed in the prior art. This simplifies the assembling process and reduces the number of parts. Accordingly, an economical electrical connector is obtained.

Furthermore, the preload projection 6 performs sliding movement between the free ends 1e of the contact 1, not between the contacting portions 1d. Accordingly, the contacting portions 1d are not adversely affected by any frictional force and any pressing force.

What is claimed is:

1. An electrical connector for electrically connecting or disconnecting a conductive pin, said connector comprising a base insulator, a cover insulator assembled onto the base insulator and relatively movable in a first direction, said cover insulator having a hole extending in a second direction normal to said first direction for passing said conductive pin therethrough, an electrical contact fixed to said base insulator and extending in said second direction, and a preload member disposed at a position adjacent said hole and extending in said first direction and integrally formed with and depending from said cover insulator, said preload member being in physical contact with said electrical contact to bias said electrical contact in a third direction perpendicular to said first and said second directions when said cover insulator is at a first position, said conductive pin being brought into physical contact with said electrical contact in place of said preload member and released from said physical contact when said cover insulator is moved from said first position to a second position in said first direction together with said conduction pin inserted in said hole, said preload projection and said cover insulator being integrally and simultaneously formed into a single body as a one-piece member, wherein said electrical contact has a free end extending in said second direction and an electrical contacting portion adjacent said extended free end, and said preload projection has a projected end and an intermediate portion which is larger than said project end, said preload projection having a dimension in said second direction so that said projected end engages with said extended free end of said electrical contact but does not reach said contacting portion of said electrical contact when said cover insulator is located at said first position.

2. An electrical connector as claimed in claim 1, wherein said electrical contact comprises a pair of resilient contact pieces connected to each other and confronting each other with a space left therebetween, said pair of resilient electrical contact pieces being spaced from each other by a first distance in said third direction at said extended free end of said electrical contact, said pair of resilient contact pieces being spaced from each other by a second distance smaller than said first distance at said contacting portion of said electrical contact.

3. An electrical connector for electrically connecting or disconnecting a conductive pin, comprising a base insulator, a cover insulator having a preload member having a projecting end and being integrally formed thereon, said cover insulator being assembled onto the base insulator and relatively movable in a first direction, said cover insulator having a hole extending in a second direction normal to said first direction for passing said conductive pin therethrough, a resilient U-shaped electrical contact fixed to said base insulator and extending in said second direction, and said preload member being disposed at a position adjacent said hole and extending in said first direction and extending from said cover insulator, said preload member being in physical contact with said electrical contact in order to bias said electrical contact in a third direction which is perpendicular to both said first and said second directions when said cover insulator is at a first position relative to said base insulator, said conductive pin being brought into physical contact with said electrical contact in place of said preload member when said preload member is released from said physical contact responsive to a movement of said cover insulator from said first position to a second position, said movement being in said first direction and together with said conductive pin inserted in said hole, said resilient U-shaped electrical contact having a free end extended in said second direction and a contacting portion adjacent said extended free end, and said preload member having a projecting end dimension in said second direction so that said projecting end engages with said extended free end of said resilient U-shaped electrical connector but does not reach said conductive pin when said cover insulator is located at said first position, said resilient U-shaped electrical contact comprising a pair of resilient contact pieces connected to each other and confronting each other with a space left therebetween, said resilient contact pieces being spaced from each other by a first distance in said third direction at said extended free end and by a second distance smaller than said first distance at said contacting portion, said preload projecting end being elongated in said first direction and having an intermediate protruding portion formed at an intermediate part in a longitudinal direction of said preload member and having a width sufficient to bias said resilient contact pieces in said third direction when said member and having a width larger than said projecting end to bias said contact pieces at said free end of said contact.

4. An electrical connector as claimed in claim 3, wherein said intermediate projection has a width in said third direction substantially equal to the diameter of said terminal pin.

5. An electrical connector as claimed in claim 3, wherein said preload projection has a first tapered portion tapered from said intermediate protruding portion towards one side in said first direction, and a second tapered portion tapered from said intermediate protruding portion towards the other side in said first direction.

6. An electrical connector comprises two planar insulator members for positioning in a face-to-face assembly with a limited lateral sliding motion between them; one of said planar members having at least one hole for receiving an electrical contact pin therein; the other of said planar members having a resilient U-shaped electrical contact therein for embracing and gripping said one contact with a predetermined pressure; said one planar member having an integral part with a preloading shape which is formed in said plastic at a position adjacent said hole, and located to first penetrate and expand said resilient U-shaped electrical contact and then to release said U-shaped contact in response to said limited lateral sliding motion of one of said insulator members relative to the other of said insulator members, whereby said pin may be inserted through the hole and into the embrace of said expanded resilient U-shaped electrical contact while two insulator members are at one location and then gripped with said predetermined pressure when said U-shaped contact is relaxed responsive to said limited lateral sliding motion away from said one location, wherein said integral part with a preloading shape has a generally boat shape having an angular prow section which enters said resilient U-shape of said electrical contact, a relatively wide mid-section which expands said U-shape contacts to receive said electrical contact pin, and a tapered stern section which does not expand said resilient U-shaped electrical contacts if it enters said U-shape while said electrical pin is gripped therein.

7. The connector of claim 6 wherein there are a plurality of said holes and said integral parts with a preloading shape arranged in a pattern corresponding to a pattern of terminal pins of a large scale integrated circuit.

8. The connector of claim 6 and an operating lever associated with said planar insulating members for causing said two members to move with said limited lateral sliding motion.

9. The connector of claim 8 wherein said operating lever has a generally L-shape with one arm of said L-shape fitting into aligned holes in said two planar insulator members, said one arm of said L-shaped operating arm have an offset section which acts as a crank to cause said limited responsive to moving the other arm of said L-shaped operating arm.

* * * * *

UNITED STATES PATENT AND TRADEMARK OFFICE
CERTIFICATE OF CORRECTION

PATENT NO. : 5,649,836
DATED : July 22, 1997
INVENTOR(S) : Shigeru Kashiwagi

It is certified that error appears in the above-indentified patent and that said Letters Patent is hereby corrected as shown below:

On the title page, item [54] and column 1, line 2, delete "MENBER" and insert --MEMBER--.

Column 8, Line 5-12 should be corrected as follows:
said contacting portion, said preload [projecting end] <u>member</u> being elongated in said first direction and having an intermediate protruding portion formed at an intermediate part in a longitudinal direction of said preload member and having a width [sufficient] <u>larger than said projecting end</u> to bias said resilient contact pieces in said third direction when said [member and having a width larger than sid projecting end to bias said] <u>preload</u> projecting end <u>is inserted between</u> said <u>resilient</u> contact pieces at said free end of said contact.

Signed and Sealed this

Twenty-third Day of December, 1997

Attest:

BRUCE LEHMAN

Attesting Officer

Commissioner of Patents and Trademarks